United States Patent
An

(10) Patent No.: US 8,891,320 B2
(45) Date of Patent: *Nov. 18, 2014

(54) SEMICONDUCTOR MEMORY APPARATUS, AND DIVISIONAL PROGRAM CONTROL CIRCUIT AND PROGRAM METHOD THEREFOR

(75) Inventor: Yong Bok An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/445,196

(22) Filed: Apr. 12, 2012

(65) Prior Publication Data

US 2013/0114356 A1    May 9, 2013

(30) Foreign Application Priority Data

Nov. 4, 2011    (KR) .......................... 10-2011-0114429

(51) Int. Cl.
*G11C 7/00*    (2006.01)
*G11C 13/00*    (2006.01)

(52) U.S. Cl.
CPC ........ *G11C 13/0004* (2013.01); *G11C 13/0038* (2013.01); *G11C 13/0061* (2013.01); *G11C 13/0011* (2013.01); *G11C 13/0069* (2013.01)

USPC .......................................... 365/191; 365/148

(58) Field of Classification Search
None
See application file for complete search history.

(56) References Cited

U.S. PATENT DOCUMENTS

| | | | |
|---|---|---|---|
| 2008/0106930 A1* | 5/2008 | Kim et al. | ...................... 365/163 |
| 2010/0165729 A1* | 7/2010 | Lee et al. | ...................... 365/163 |
| 2011/0283081 A1 | 11/2011 | Barkley et al. | |

FOREIGN PATENT DOCUMENTS

| | | |
|---|---|---|
| JP | 2007250171 A | 9/2007 |
| KR | 1020110029402 A | 3/2011 |

* cited by examiner

*Primary Examiner* — James G Norman
(74) *Attorney, Agent, or Firm* — William Park & Associates Ltd.

(57) ABSTRACT

A semiconductor memory apparatus includes a program pulse generation block configured to generate write control signals and a program completion signal; a divisional program control circuit configured to generate a divisional programming enable signal according to a predetermined number of program division times, in response to the program completion signal; and a controller configured to generate the programming enable signal in response to the divisional programming enable signal.

28 Claims, 15 Drawing Sheets

SEMICONDUCTOR MEMORY APPARATUS, AND DIVISIONAL PROGRAM CONTROL CIRCUIT AND PROGRAM METHOD THEREFOR

CROSS-REFERENCES TO RELATED APPLICATION

The present application claims priority under 35 U.S.C. §119(a) to Korean application number 10-2011-0114429, filed on Nov. 4, 2011, in the Korean Intellectual Property Office, which is incorporated herein by reference in its entirety.

BACKGROUND

1. Technical Field

The present invention relates to a semiconductor system, and more particularly, to a semiconductor memory apparatus, and a divisional program control circuit and a program method therefor.

2. Related Art

A PCRAM (phase change RAM) is a memory apparatus which uses a phase change characteristic of a specified substance constituting a memory cell. A phase change substance may be converted into an amorphous state or a crystalline state depending upon a temperature condition, and may include, for example, a chalcogenide-based alloy. A representative phase change substance includes a Ge2Sb2Te5 (hereafter referred to as a 'GST') substance which comprises germanium, antimony and tellurium.

Most substances have different melting points and crystallization temperatures, and their degree of crystallization may vary depending upon a cooling time and a cooling temperature. This may serve as a unique characteristic of a substance. In particular, a GST substance may be more clearly distinguished between the amorphous state and the crystalline state than other substances.

FIG. 1 is a graph for explaining phase changes of a general phase change substance depending upon a temperature. A GST substance will be used as an example.

When GST is applied with a high temperature equal to or greater than the melting point of GST for a predetermined time (several tens to several hundreds nanoseconds [ns]) and is quenched for a preset time Tq, the amorphous state of the GST is maintained as it is, and a resistance value becomes several hundreds kilohms (kΩ) to several megohms (MΩ).

Also, if the GST is maintained at a crystallization temperature for a preselected time (several hundreds ns to several microseconds [μs]) and is then cooled, the GST is converted into the crystalline state and the resistance value becomes several kΩ to several tens kΩ. As a time for maintaining the crystallization temperature is lengthened, the crystalline state improves and, accordingly the GST has a smaller resistance value.

FIG. 2 is another graph for explaining phase changes of the general phase change substance depending upon a temperature. Similarly, the GST substance will be used as an example.

FIG. 2 shows an example in which the GST is crystallized by applying a temperature near the melting point of GST for a predetermined time, and slowly cooling the GST. Even in this case, the resistance value of the GST becomes several kΩ to several tens kΩ, and as a cooling time is lengthened, the crystalline state improves. Also, a crystallization time is shortened when compared to FIG. 1.

In order to use such a characteristic of the GST, heat may be directly applied to the GST; or Joule's heat may be electrically generated by current flow through a conductor or a semiconductor to convert the GST between the amorphous state and the crystalline state.

While FIGS. 1 and 2 show general operations of the phase change memory apparatus, the method of FIG. 2 is mainly used since a set data program time, that is, a time required for crystallizing the GST is short.

FIG. 3 is a configuration diagram of a cell array of a conventional phase change memory apparatus.

Referring to FIG. 3, each memory cell MC is constituted by a phase change substance GST and a switching element which are connected between a word line WL and a bit line BL.

Program operations of a phase change memory apparatus will be described below with reference to FIG. 4.

FIG. 4 is a configuration diagram of a conventional phase change memory apparatus.

Referring to FIG. 4, a phase change memory apparatus 1 includes a program pulse generation block 11, a write driver 12, and a memory block 13.

The program pulse generation block 11 is configured to generate a first write control signal RESETEN and second write control signals SETP<0:n> in response to a programming enable signal PGMP. The program pulse generation block 11 provides the first write control signal RESETEN and the second write control signals SETP<0:n> to the write driver 12. Further, when the operation of generating the first write control signal RESETEN and the second write control signals SETP<0:n> is completed, the program pulse generation block 11 generates a program completion signal PGMNDP and transmits the program completion signal PGMNDP to a controller.

The write driver 12 is configured to be driven in response to a write enable signal WDEN. The write driver 12 is provided with the first write control signal RESETEN and the second write control signals SETP<0:n>, and provides program current I_PGM to the memory block 13 in response to data DATA to be programmed and bit line select switch control signals YSW<0:m>.

Accordingly, in the memory block 13, as the resistant state of a GST is changed depending upon the level of the data DATA to be programmed, the data DATA can be recorded.

FIG. 5 is an example block diagram of the program pulse generation block shown in FIG. 4.

Referring to FIG. 5, the program pulse generation block 11 is configured to include an initial pulse generation unit 111, a reset pulse generation unit 113, and a quenching pulse generation unit 115.

The initial pulse generation unit 111 is configured to generate a period setting signal QSSETP in response to the programming enable signal PGMP which is provided from the controller. The period setting signal QSSETP is a signal which determines a time to supply heat near a melting point to the GST. The initial pulse generation unit 111 enables the period setting signal QSSETP after counting a preset time in response to the programming enable signal PGMP.

The reset pulse generation unit 113 is configured to generate the first write control signal RESETEN in response to the programming enable signal PGMP and a reset signal IRSTP which is generated by delaying the period setting signal QSSETP by a predefined time.

The quenching pulse generation unit 115 is configured to generate the second write control signals SETP<0:n> which have different enable periods, in response to the programming enable signal PGMP and the period setting signal QSSETP. Further, the quenching pulse generation unit 115 generates a program completion signal PGMNDP when the generation of the second write control signals SETP<0:n> is completed.

According to such a configuration, the reset pulse generation unit 113 generates the first write control signal RESETEN during a period from after the programming enable signal PGMP is enabled to when the reset signal IRSTP is enabled. The quenching pulse generation unit 115 enables the second write control signals SETP<0:n> at the same levels until the period setting signal QSSETP is enabled, and generates the second write control signals SETP<0:n>, after the period setting signal QSSETP is generated.

FIG. 6 is a timing diagram illustrating program operations of the conventional phase change memory apparatus.

As a program command PGM is applied, the programming enable signal PGMP is generated from the controller. Accordingly, the initial pulse generation unit 111 operates and generates an internal clock enable signal IPWEN. Then, after an internal clock ICK is generated, counting codes Q<0:3> are generated by counting the preset time, and when the counting is completed, the period setting signal QSSETP is generated.

The reset pulse generation unit 113 enables the first write control signal RESETEN in response to the programming enable signal PGMP, and disables the first write control signal RESETEN as the reset signal IRSTP is enabled. The reset signal IRSTP is generated by delaying the period setting signal QSSETP by the predefined time. During a period in which the first write control signal RESETEN is enabled, programming current is generated from the write driver 12 and is provided to a bit line BL0.

The quenching pulse generation unit 115 generates a count enable signal CKEN (CNTENB) and an internal clock QSCK in response to the period setting signal QSSETP. Accordingly, the second write control signals SETP<0:3> which have different enable periods are generated. When generation of the second write control signal SETP<0:3> is completed, a quenching pulse completion signal QSND is disabled, and then, when a reset signal QSRSTP is enabled, the program completion signal PGMNDP is outputted. In this case, the current driving force of the write driver 12 is sequentially damped according to the enable periods of the second write control signals SETP<0:3>, and a quenching pulse is provided to the GST.

In a program operation, a word line maintains a high potential (equal to or greater than VCC) when a word line select switch is in a disabled state, and is discharged to the level of a ground voltage as the word line select switch is enabled. A current path is formed via a bit line that is selected by the write driver 12. The current path is formed by the write driver 12 through a bit line select switch, the bit line, a switching element and the GST to the word line.

When the current path is formed in this way, the amount of current driven by the write driver 12 is determined according to the first write control signal RESETEN or the second write control signals SETP<0:n> depending upon a data level (0/1) to be programmed, and the program current is provided to the memory cell through the bit line. For example, when assuming that an amount of current provided by the first write control signal RESETEN is 100%, an amount of current provided to the memory cell when all of the second write control signals SETP<0:3> are enabled is controlled to a rate of 30 to 90%.

In the program operation, the current provided through the bit line is provided in a rectangular type in the case of reset data. In the case of set data, the current is provided initially in a type similar to a rectangular type but is then provided by being reduced into a step type by the second write control signals SETP<0:n>. Further, current consumed in a program operation is about 1 mA. Thus, 16 mA is consumed when programming is performed by the unit of X16, and 32 mA is consumed when programming is performed by the unit of X32.

In this regard, since a bit line select switch is connected to each cell, there is no problem with how current is supplied. However, since a plurality of cells are connected to a word line select switch, one word line select switch should take charge of current supply for all the of plurality of cells, and the size of a transistor constituting the word line select switch should be correspondingly increased.

An increase in the size of a transistor leads to an increase in the size of a chip. Also, when a large amount of current flows through the transistor at one time, a program error may be caused due to an influence of noise resulting from ground bounce.

SUMMARY OF THE INVENTION

In one embodiment of the present invention, a semiconductor memory apparatus includes: a program pulse generation block configured to generate write control signals and a program completion signal in response to a programming enable signal; a divisional program control circuit configured to generate a divisional programming enable signal according to a predetermined number of program division times, in response to the program completion signal; and a controller configured to generate the programming enable signal in response to the divisional programming enable signal.

In another embodiment of the present invention, a semiconductor memory apparatus includes: a program pulse generation block configured to output write control signals in response to a programming enable signal which is generated according to a divisional programming enable signal; and a write driver configured to provide a program pulse generated in response to the write control signals, to a memory block.

In another embodiment of the present invention, a divisional program control circuit is connected with a program pulse generation block which generates a program completion signal, in response to a programming enable signal which is generated according to a divisional programming enable signal, and the divisional program control circuit generates the divisional programming enable signal according to a predetermined number of program division times, in response to the program completion signal.

In another embodiment of the present invention, a program method for a semiconductor memory apparatus includes: inputting program data to the semiconductor memory apparatus comprising a program pulse generation block; repeatedly generating a programming enable signal with a preset cycle in correspondence to a predetermined number of program division times by the program pulse generation block; and programming data to a selected region of a memory block by a write driver, in response to the programming enable signal.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus, and a divisional program control circuit and a program method therefor according to the present invention will be described below with reference to the accompanying drawings through example embodiments.

Figure 1:
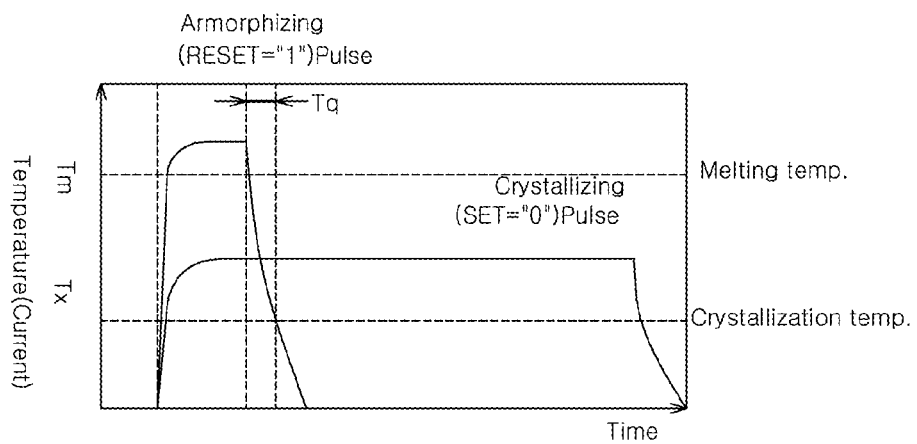
FIG. 1 is a graph for explaining phase changes of a general phase change substance depending upon a temperature.
Figure 2:
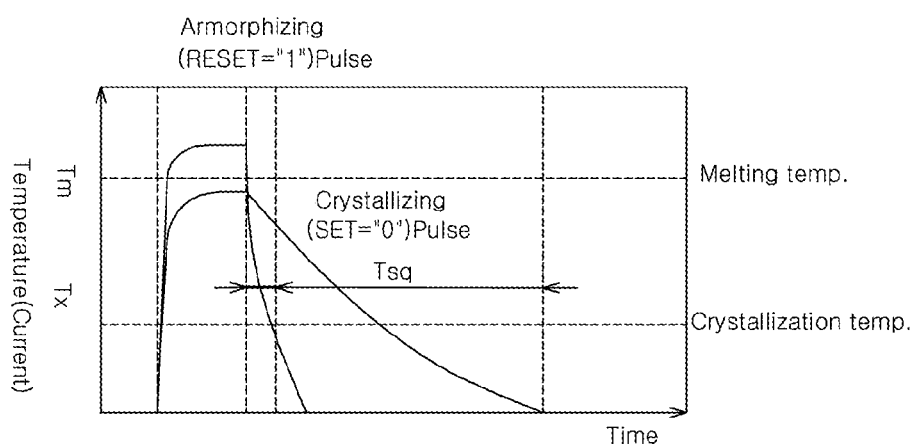
FIG. 2 is another graph for explaining phase changes of the general phase change substance depending upon a temperature.
Figure 3:
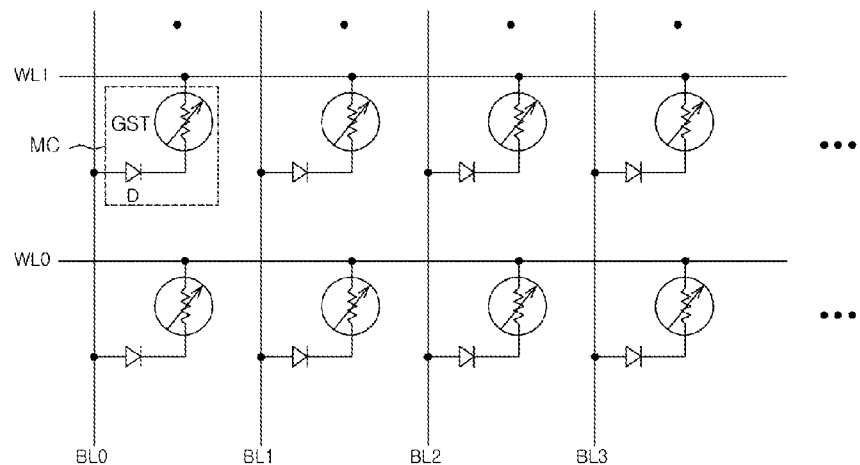
FIG. 3 is a configuration diagram of a cell array of a conventional phase change memory apparatus.
Figure 4:
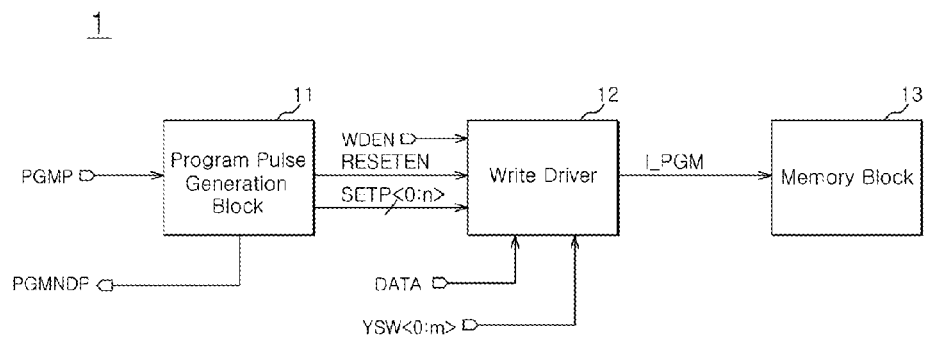
FIG. 4 is a configuration diagram of a conventional phase change memory apparatus.
Figure 5:
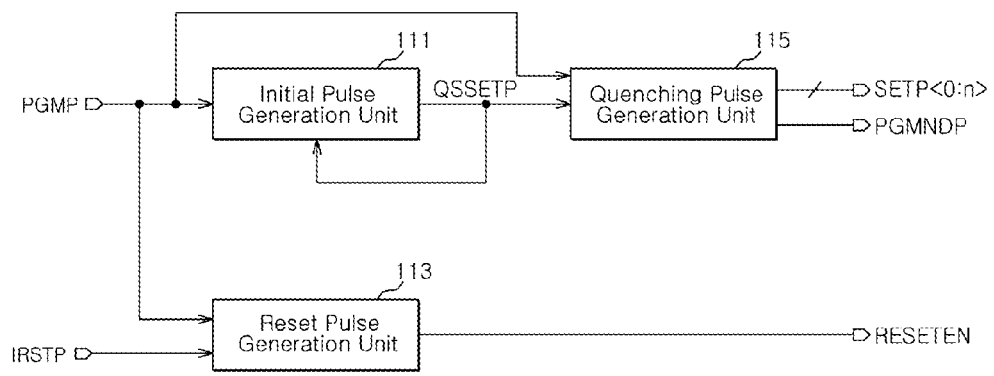
FIG. 5 is a block diagram exemplifying the program pulse generation block shown in FIG. 4.
Figure 6:
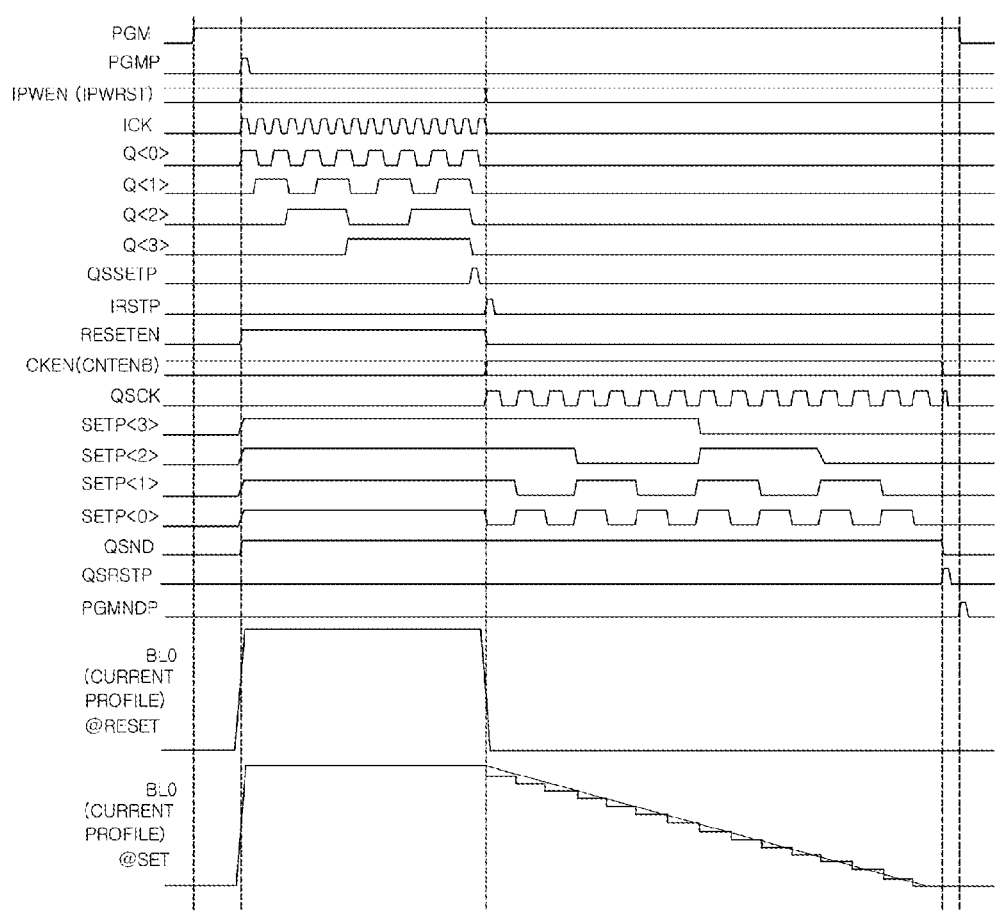
FIG. 6 is a timing diagram illustrating program operations of the conventional phase change memory apparatus.
Figure 7:
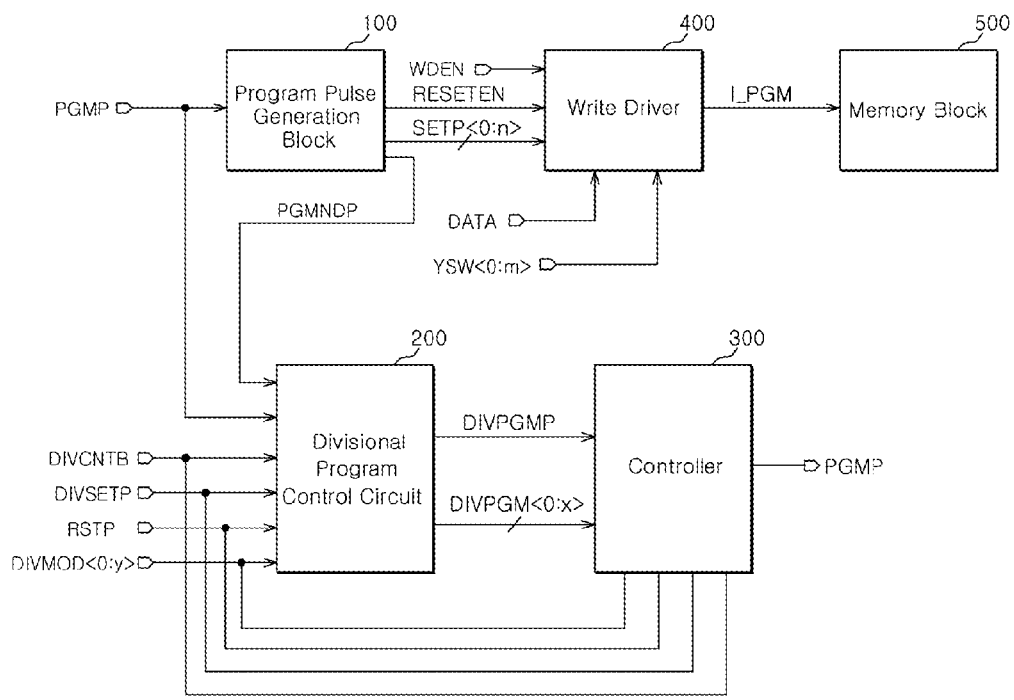
FIG. 7 is a configuration diagram of a semiconductor memory apparatus in accordance with an embodiment of the present invention.

FIG. 7 is a configuration diagram of a semiconductor memory apparatus in accordance with an embodiment of the present invention.

Referring to FIG. 7, a semiconductor memory apparatus 10 may include a program pulse generation block 100, a divisional program control circuit 200, a controller 300, a write driver 400 and a memory block 500. The program pulse generation block 100 may be configured to generate a first write control signal RESETEN and second write control signals SETP<0:n> in response to a programming enable signal PGMP. The divisional program control circuit 200 may be configured to generate a divisional programming enable signal DIVPGMP and division codes DIVPGM<0:x> according to a preset division mode. The divisional program circuit 200 may be connected with the program pulse generation block 100. The controller 300 may be configured to provide program operation-related control signals including the programming enable signal PGMP, an address and a data signal. The write driver 400 may be configured to generate program current I_PGM for programming input data DATA in response to the write control signals RESETEN and SETP<0:n> provided from the program pulse generation block 100 and bit line select switch control signals YSW<0:m>. The memory block 500 may include a plurality of memory cells and may be configured to record data in respective memory cells according to current provided from the write driver 400.

In the semiconductor memory apparatus 10, the divisional program control circuit 200 generates the divisional programming enable signal DIVPGMP for allowing a program operation to be repeatedly performed according to the preset division mode, that is, by the number of divided regions of a memory block, and provides the divisional programming enable signal DIVPGMP to the controller 300. The controller 300 provides the programming enable signal PGMP generated in response to the divisional programming enable signal DIVPGMP, to the program pulse generation block 100 so that a program operation is performed a predetermined number of times (iterations). Thus, the program pulse generation block 100 may generate the programming enable signal PGMP with a preset cycle in correspondence to a predetermined number of program division times, where the programming enable signal PGMP is repeatedly generated with a generating cycle of the program completion signal.

In addition, the divisional program control circuit 200 also generates the division codes DIVPGM<0:x> and provides the division codes DIVPGM<0:x> to the controller 300. The controller 300 drives a write driver 400 which is designated by the division codes DIVPGM<0:x> so that a program operation is performed in a corresponding region of a memory block.

Operations of the respective component parts will be described below in detail.

The program pulse generation block 100 generates the first write control signal RESETEN and the second write control signals SETP<0:n> in response to the programming enable signal PGMP generated by the controller 300. The program pulse generation block 100 provides the first write control signal RESETEN and the second write control signals SETP<0:n> to the write driver 400. Further, when the operation of generating the first write control signal RESETEN and the second write control signals SETP<0:n> is completed, the program pulse generation block 100 generates a program completion signal PGMNDP and transfers the program completion signal PGMNDP to the divisional program control circuit 200. That is to say, when a program operation is completed one time by the first and second write control signals RESETEN and SETP<0:n> generated by the program pulse generation block 100, the program completion signal PGMNDP is communicated to the divisional program control circuit 200 as an indication that a program operation has completed, so that a subsequent program operation may be performed according to the division mode.

The write driver 400 is driven in response to a write enable signal WDEN. The write driver 400 is provided with the first write control signal RESETEN and the second write control signals SETP<0:n>, and the write driver 400 provides the program current I_PGM to the memory block 500 in response to the data DATA to be programmed and the bit line select switch control signals YSW<0:m>.

According to this fact, data may be recorded in the memory block 500 according to the level of the data DATA to be programmed. In an embodiment of the present invention, the memory block 500 may be configured using memory cells in and from which data are recorded and sensed by a current driving scheme. The memory cells in and from which data are recorded and sensed by the current driving scheme include, for example, phase change memory cells, and magnetic memory cells.

The divisional program control circuit 200 uses the program completion signal PGMNDP provided from the program pulse generation block 100, as a clock signal, and generates the divisional programming enable signal DIVPGMP and the division codes DIVPGM<0:x> according to the preset division mode. In other words, the divisional program control circuit 200 performs a counting operation according to a predetermined number of divisional program times, and transfers the divisional programming enable signal DIVPGMP generated as a result of the counting operation, to the write driver 400 and the controller 300. Further, the divisional program control circuit 200 generates the division codes DIVPGM<0:x> for determining divisional program regions according to the preset division modes. The divisional program regions may be set, but not limited to, using a fuse option, a mode register set (MRS) or a test mode signal.

In an embodiment of the present invention, the divisional program control circuit 200 may be configured, without a limiting sense, to operate after a program operation is completed one time by the write control signals RESETEN and SETP<0:n> which are generated by the program pulse generation block 100.

If the division mode is 1, that is, a region to be programmed is not divided, a program mode is ended after the program is performed one time according to the first and second write control signals RESETEN and SETP<0:n>.

Meanwhile, when a program region is divided into two (the division mode is 2), program is repeated two times, and when a program region is divided into four (the division mode is 4), program is repeated four times. In this way, program is repeated by a number by which the program region is divided.

When a program operation is performed all at once without dividing the program region, an amount of current, with which a word line select switch should be charged, increases as a program handling unit increases. Accordingly, the size of the word line select switch increases, and as peak current flows, a program error may be caused due to an influence of noise resulting from ground bounce.

However, in an embodiment of the present invention, as the program region is divided, peak current may be reduced and control may be made so that an error does not occur.

Meanwhile, although the divisional program control circuit 200 is shown independently of the program pulse generation block 100 in FIG. 7, the divisional program control circuit 200 may be configured to be included in the program pulse generation block 100. That is to say, the program pulse generation block 100 may include the divisional program control circuit 200.

Figure 8:
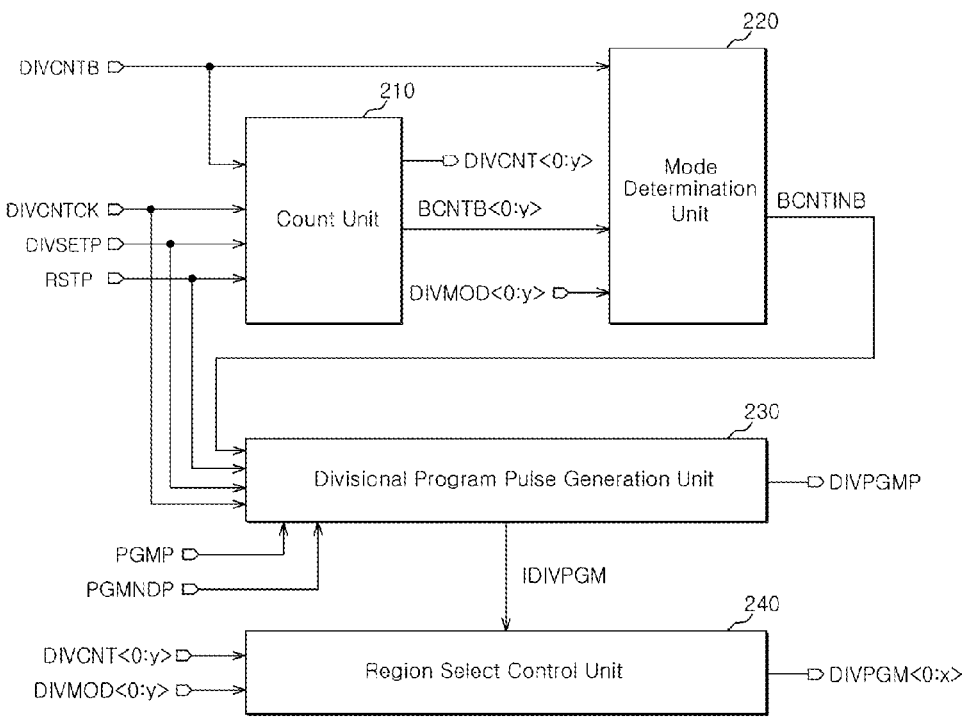
FIG. 8 is a configuration diagram of a divisional program control circuit in accordance with an embodiment of the present invention.
Figure 9:
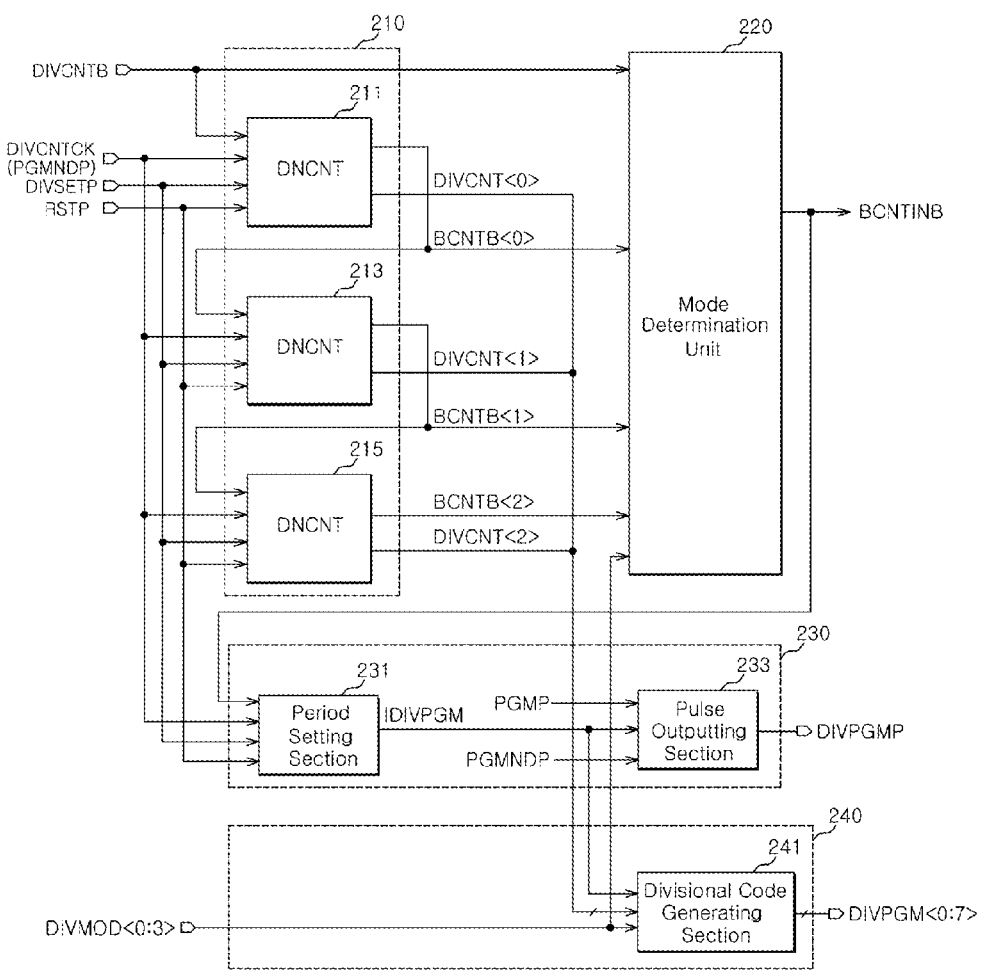
FIG. 9 is a view exemplifying the divisional program control circuit shown in FIG. 8.

FIG. 8 is a configuration diagram of a divisional program control circuit in accordance with an embodiment of the present invention, and FIG. 9 is a view exemplifying the divisional program control circuit shown in FIG. 8.

Referring to FIGS. 8 and 9, the divisional program control circuit 200 may be configured to include a count unit 210, a mode determination unit 220, a divisional program pulse generation unit 230, and a region select control unit 240.

The count unit 210 is configured to count the number of divisional program times in response to a clock signal DIVCNTCK, a set signal DIVSETP and a reset signal RSTP which are generated from a count enable signal DIVCNTB and the program completion signal PGMNDP. As the clock signal DIVCNTCK generated from the program completion signal PGMNDP is used, the counting operation for divisional program may be performed after a program operation is completed one time. The count unit 210 outputs count signals DIVCNT<0:y> and count completion signals BCNTB<0:y> as a result of such a counting operation. The count signals DIVCNT<0:y> are transferred to the region select control unit 240 which will be described later in detail, and the count completion signals BCNTB<0:y> are transferred to the mode determination unit 220.

As shown in FIG. 9, the count unit 210 may be configured, for example, using three stage down counters (DNCNT) 211, 213 and 215.

The first stage down counter 211 performs counting in response to the clock signal DIVCNTCK when a count enable signal DIVCNTB is enabled, for example, to a low level, and outputs the first count signal DIVCNT<0> and the first count completion signal BCNTB<0>.

The first count completion signal BCNTB<0> is used as a signal for enabling the next stage down counter 213. Accordingly, the down counter 213 outputs the second count signal DIVCNT<1> and the second count completion signal BCNTB<1>, and the down counter 215 outputs the third count signal DIVCNT<2> and the third count completion signal BCNTB<2>.

The count completion signals BCNTB<0:2> outputted from the respective down counters 211, 313 and 215 may be provided to the mode determination unit 220, and the count signals DIVCNT<0:y> may be provided to the divisional code generating section 241 of the region select control unit 240. Thus, the count unit 210 may comprise a plurality of counters that are connected in series to count a number of divisional program times (iterations) in response to a count enable signal.

Due to this fact, the count unit 210 operates in such a manner that a next program pulse may be generated after a program operation is completed as one program pulse is generated. If all divisional programming is completed, the count unit 210 is reset by the reset signal RSTP so the operation of the count unit 210 is ended.

The mode determination unit 220 is configured to generate a mode determination signal BCNTINB in response to the count enable signal DIVCNTB, the count completion signals BCNTB<0:y> and division mode signals DIVMOD<0:y>. Namely, if counting is completed in the count unit 210, the mode determination unit 220 generates the mode determination signal BCNTINB which determines the number of times that the divisional program is performed, according to the preset division mode signals DIVMOD<0:y>.

The mode determination signal BCNTINB generated by the mode determination unit 220 is provided to the divisional program pulse generation unit 230. As shown in FIG. 9, the divisional program pulse generation unit 230 may be configured to include a period setting section 231 and a pulse outputting section 233.

The period setting section 231 is configured to generate a divisional period enable signal IDIVPGM which indicates that it is a divisional program period. The period setting section 231 may generate the divisional period enable signal IDIVPGM in response to the mode determination signal BCNTINB, the clock signal DIVCNTCK, the set signal DIVSETP and the reset signal RSTP. In detail, when the divisional period enable signal IDIVPGM is set to a high level according to the set signal DIVSETP, the divisional period enable signal IDIVPGM is reset to a low level when the clock signal DIVCNTCK is inputted, and indicates that it is a divisional program period.

The pulse outputting section 233 is configured to generate the divisional programming enable signal DIVPGMP in response to the programming enable signal PGMP, the divisional period enable signal IDIVPGM and the program completion signal PGMNDP, and the pulse outputting section 233 provides the divisional programming enable signal DIVPGMP to the controller 300. The pulse outputting section 233 is configured to transfer the programming enable signal PGMP (notifying start of a program operation) without modifying the programming enable signal PGMP before the divisional period enable signal IDIVPGM is set to the high level, and the pulse outputting section 233 is configured to transfer the program completion signal PGMNDP when the divisional period enable signal IDIVPGM is enabled to the high level.

In an embodiment of the present invention, the period setting section 231 may be constituted by, but not limited to, a down counter.

The region select control unit 240 may be configured to include the divisional code generating section 241 as shown in FIG. 9. The divisional code generating section 241 is configured to generate the division codes DIVPGM<0:x> in response to the divisional period enable signal IDIVPGM, the count signals DIVCNT<0:y> and the division mode signals DIVMOD<0:y>. The division mode signals DIVMOD<0:y> may be set, but not limited to, using a fuse option, a mode register set (MRS) or a test mode signal.

The divisional code generating section 241 may combine some of the division mode signals DIVMOD<0:y>, for example, the division mode signals DIVMOD<0:3>, and the count signals DIVCNT<0:2> and generate the division codes DIVPGM<0:7> as flag signals, and the divisional code generating section 241 may transfer the division codes DIVPGM<0:7> to the controller 300.

In an embodiment of the present invention, the division mode signals DIVMOD<0:3> may be generated from division option codes DIVMODE<0:1> which are preset to a fuse option, an MRS or a test mode signal.

As is apparent from the above descriptions, the divisional program control circuit 200 in accordance with an embodiment of the present invention performs program operations by dividing a program region of a memory block so that peak current is reduced and memory cells are stably programmed.

To this end, the count unit 210 performs counting until the reset signal RSTP is enabled according to the program completion signal PGMNDP. When counting by the count unit 210 is completed, the mode determination unit 220 determines the division mode according to the preset division mode signals DIVMOD<0:y> in correspondence to divided regions and generates the mode determination signal BCNTINB. Also, if the period setting section 231 generates the divisional period enable signal IDIVPGM which indicates that it is a divisional program period, the pulse outputting section 233 generates the divisional programming enable signal DIVPGMP according to a level of the divisional period enable signal IDIVPGM, and the region select control unit 240 generates the division codes DIVPGM<0:x> which designate memory regions where divisional programming is to be performed.

As a result, a specific write driver is driven by the division codes DIVPGM<0:x>, and as the program pulse generation block 100 generates the first write control signal RESETEN and the second write control signals SETP<0:n>, the divisional program operation is performed a predetermined number of division times. Accordingly, as the first write control signal RESETEN and the second write control signals SETP<0:n> are generated the predetermined number of division times, data may be selectively programmed to the memory cells.

Figure 10:
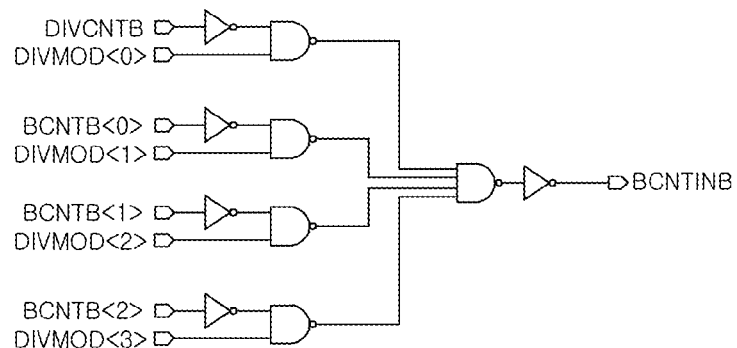
FIG. 10 is a view exemplifying the mode determination unit shown in FIG. 8.

FIG. 10 is a view exemplifying the mode determination unit shown in FIG. 8.

Referring to FIG. 10, the mode determination unit 220 combines the count enable signal DIVCNTB, the count completion signals BCNTB<0:2> and the division mode signals DIVMOD<0:y>, and generates the mode determination signal BCNTINB.

In detail, the mode determination unit 220 selects and outputs the count enable signal DIVCNTB in a program mode with the number of division times of 1, selects and outputs only the first count completion signal BCNTB<0> in a program mode with the number of division times of 2, selects and outputs the first and second count completion signals BCNTB<0> and BCNTB<1> in a program mode with the number of division times of 4, and selects and outputs all the first to third count completion signals BCNTB<0>, BCNTB<1> and BCNTB<2> in a program mode with the number of division times of 8.

To this end, control may be made such that the count unit 210 does not operate when the number of division times is 1, only the first down counter 211 of the count unit 210 is operated when the number of division times is 2, the first and second down counters 211 and 213 of the count unit 210 are operated when the number of division times is 4, and the first to third down counters 211, 213 and 215 of the count unit 210 are operated when the number of division times is 8.

Furthermore, it can be seen that a circuit configuration is simplified because the division mode signals DIVMOD<0:y> are configured to be low-enabled so that the output of a down counter corresponding to a selected division mode is not selected but the output of an unselected down counter is selected.

Figure 11:
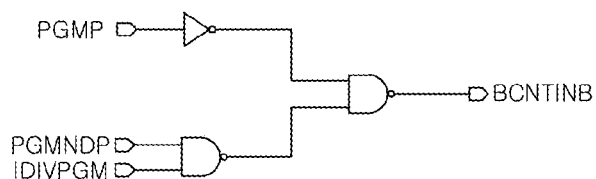
FIG. 11 is a view exemplifying a pulse outputting section shown in FIG. 9.

FIG. 11 is a view exemplifying the pulse outputting section shown in FIG. 9.

When a program operation is initially started, the programming enable signal PGMP is transferred unmodified as the divisional programming enable signal DIVPGMP. In a period in which the divisional period enable signal IDIVPGM indicating a divisional program period is generated, since the programming enable signal PGMP is disabled, the program completion signal PGMNDP is transferred as the divisional programming enable signal DIVPGMP, by which a pulse signal DIVPGMP for divisional program is generated.

Figure 12:
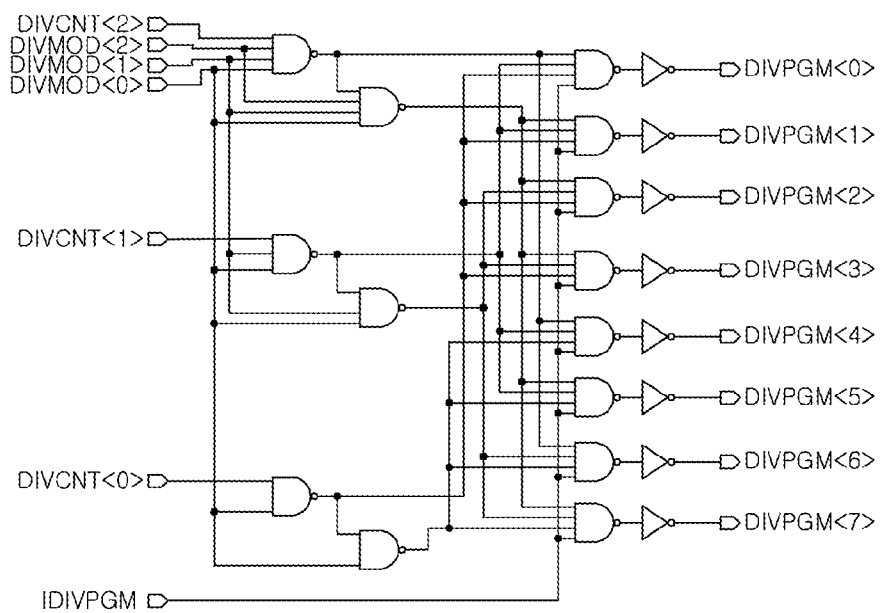
FIG. 12 is a view exemplifying the divisional code generating section shown in FIG. 9.

FIG. 12 is a view exemplifying the divisional code generating section shown in FIG. 9.

The divisional code generating section 241 may comprise a decoder which generates the division codes DIVPGM<0:7> in response to the divisional period enable signal IDIVPGM, the count signals DIVCNT<0:2> and the division mode signals DIVMOD<0:2>. Moreover, while it is exemplified in FIG. 12 that the division codes DIVPGM<0:7> of 8 bits are generated and the number of division times is set to 8 in maximum, it is conceivable that the number of division times may be further increased.

Referring to FIG. 12, in a program mode with the number of division times of 1, the division codes DIVPGM<0:7> are all enabled (for example, to high levels).

When the number of division times is 2, even-numbered division codes of the division codes DIVPGM<0:7> are enabled in a first divisional program mode, and odd-numbered division codes of the division codes DIVPGM<0:7> are enabled in a second divisional program mode.

When the number of division times is 4, the division codes DIVPGM<0, 4> are enabled in a first divisional program mode, the division codes DIVPGM<1, 5> are enabled in a second divisional program mode, the division codes DIVPGM<2, 6> are enabled in a third divisional program mode, and the division codes DIVPGM<3, 7> are enabled in a fourth divisional program mode.

Similarly, when the number of division times is 8, the division codes DIVPGM<0:7> are enabled sequentially enabled and are transferred to a write driver and a controller.

Figure 13:
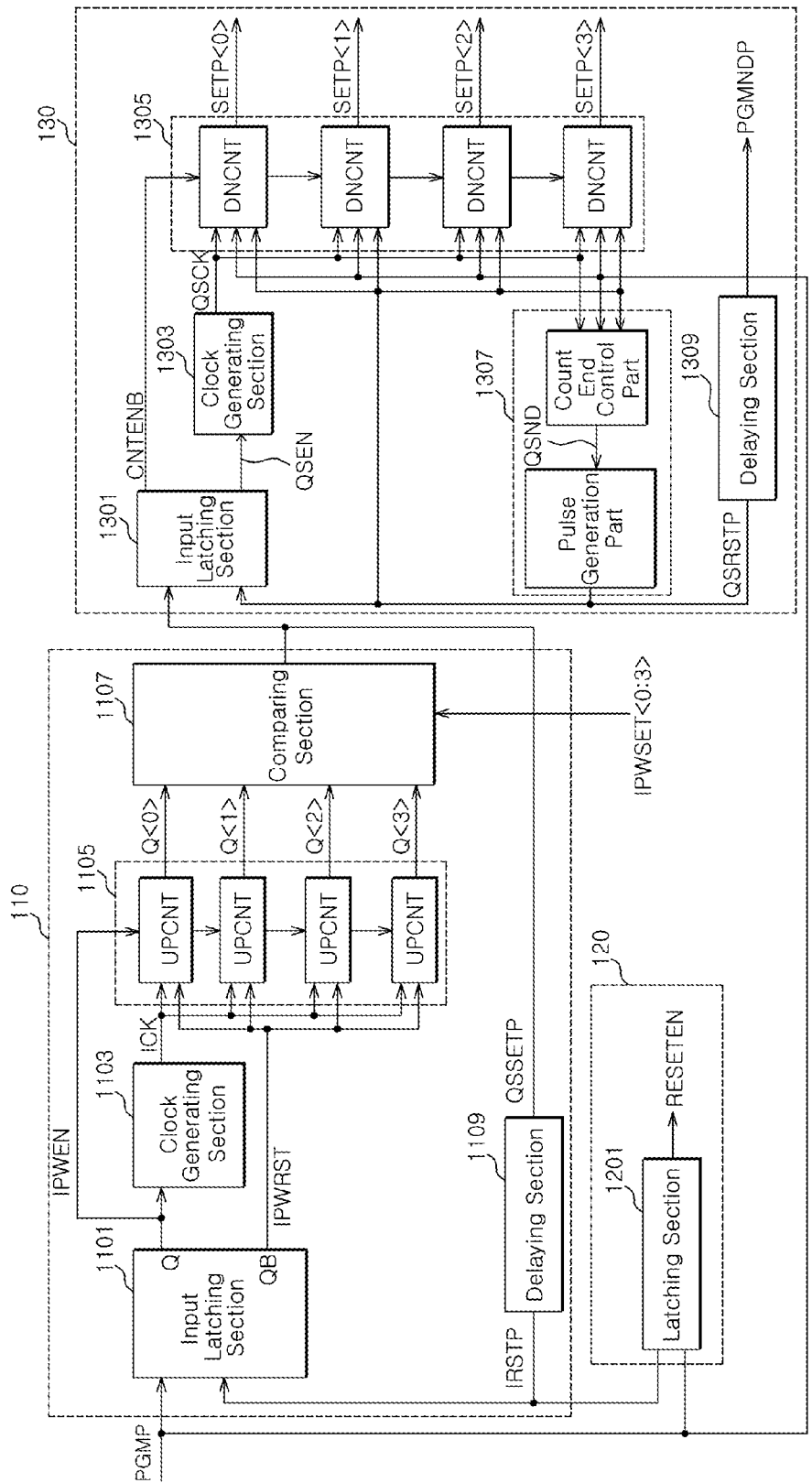
FIG. 13 is a view exemplifying a program pulse generation block which may be applied to an embodiment the present invention.

FIG. 13 is a view exemplifying a program pulse generation block which may be included in the present invention.

Referring to FIG. 13, the program pulse generation block 100 includes an initial pulse generation unit 110, a reset pulse generation unit 120, and a quenching pulse generation unit 130.

The initial pulse generation unit 110 is configured to generate the period setting signal QSSETP in response to the programming enable signal PGMP which is provided from the controller 300. The period setting signal QSSETP is a signal for determining a time for providing heat near a melting point to a GST. The initial pulse generation unit 110 enables the period setting signal QSSETP after counting a predetermined time interval in response to the programming enable signal PGMP.

The reset pulse generation unit 120 is configured to generate the first write control signal RESETEN in response to the programming enable signal PGMP and the reset signal IRSTP which is generated by delaying the period setting signal QSSETP by a predefined time interval.

The quenching pulse generation unit 130 is configured to generate the second write control signals SETP<0:n> which have different enable periods, in response to the programming enable signal PGMP and the period setting signal QSSETP. When the generation of the second write control signals SETP<0:n> is completed, the quenching pulse generation unit 130 generates the program completion signal PGMNDP.

According to the configuration as described above, the reset pulse generation unit 120 generates the first write control signal RESETEN during a period from after the programming enable signal PGMP is enabled to until the reset signal IRSTP is enabled. The quenching pulse generation unit 130 enables the second write control signals SETP<0:n> at the same levels from after the programming enable signal PGMP is enabled to until the period setting signal QSSETP is enabled, and generates the second write control signals SETP<0:n> which are controlled in the enable periods thereof, after the period setting signal QSSETP is generated.

Detailed descriptions will be given below.

First, the initial pulse generation unit 110 includes an input latching section 1101, a clock generating section 1103, a first counting section 1105, a comparing section 1107, and a delaying section 1109.

The input latching section 1101 is configured to output the internal clock enable signal IPWEN and a count reset signal IPWRST in response to the programming enable signal PGMP and the reset signal IRSTP. That is to say, if the programming enable signal PGMP is enabled, for example, to a high level, the internal clock enable signal IPWEN is activated to a high level, and if the reset signal IRSTP is enabled to a high level, the count reset signal IPWRST is activated to a high level.

In detail, the input latching section 1101 may be configured such that the internal clock enable signal IPWEN is enabled to the high level and the count reset signal IPWRST is enabled to a low level. The input latching section 1101 may be configured using an R-S latch constituted by a NAND gate or a NOR gate, or a flip-flop.

The clock generating section 1103 is configured to generate an internal clock ICK in response to the internal clock enable signal IPWEN. In other words, the clock generating section 1103 outputs the internal clock ICK which toggles while the internal clock enable signal IPWEN is activated to the high level.

The first counting section 1105 is configured to output counting codes Q<0:3> which are counted according to control of the internal clock enable signal IPWEN, the count reset signal IPWRST and the internal clock ICK. Namely, the first counting section 1105 performs a counting operation according to control of the internal clock ICK when the internal clock enable signal IPWEN is activated to the high level. If the count reset signal IPWRST is activated to the high level, the counting codes Q<0:3> outputted from the first counting section 1105 are initialized. In this way, as the counting codes Q<0:3> are generated using the first counting section 1105, a circuit size may be significantly reduced. The first counting section 1105 may be configured by up counters.

The comparing section 1107 is configured to activate and output the period setting signal QSSETP when the counting codes Q<0:3> reach a preset value. In detail, the comparing section 1107 is configured to compare the counting codes Q<0:3> with time control codes IPWSET<0:3> applied, and the comparing section 1107 is configured to activate the period setting signal QSSETP when the counting codes Q<0:3> are the same as the time control codes IPWSET<0:3>. That is to say, the activation timing of the period setting signal QSSETP may be controlled by controlling the time control codes IPWSET<0:3>.

In an embodiment of the present invention, the generation timing of the period setting signal QSSETP may be delayed by simultaneously increasing the number of counters constituting the first counting section 1105 and the number of time control codes IPWSET. This means that a time required for melting the GST constituting a memory cell may be changed.

The delaying section 1109 is configured to delay the period setting signal QSSETP by the predetermined time interval and output the reset signal IRSTP. The delay value of the delaying section 1109 is set to satisfy a prescribed timing margin. The reset signal IRSTP generated by the delaying section 1109 resets the input latching section 1101 and disables the internal clock enable signal IPWEN, and enables the count reset signal IPWRST such that the clock generating section 1103 and the first counting section 1105 are disabled.

The reset pulse generation unit 120 is enabled by the programming enable signal PGMP and is disabled by the period setting signal QSSETP. In other words, the reset pulse generation unit 120 generates the first write control signal RESETEN for the time set by the time control codes IPWSET<0:3>, and provides the first write control signal RESETEN to the write driver 400.

Next, the quenching pulse generation unit 130 may be configured to include an input latching section 1301, a clock generating section 1303, a second counting section 1305, a reset controlling section 1307, and a delaying section 1309.

The input latching section 1301 is configured to output the count enable signal CNTENB and the internal clock enable signal QSEN in response to the period setting signal QSSETP and the reset signal QSRSTP. The clock generating section 1303 is configured to generate an internal clock QSCK in response to an internal clock enable signal QSEN. Namely, the clock generating section 1303 outputs the internal clock QSCK which toggles while the internal clock enable signal QSEN is activated to a high level.

The second counting section 1305 is configured to output the second write control signals SETP<0:3> in response to a count enable signal CNTENB, the internal clock QSCK, the programming enable signal PGMP and a reset signal QSRSTP. Accordingly, the update cycle of the second write control signals SETP<0:3> is controlled in correspondence to the toggling cycle of the internal clock QSCK.

In an embodiment of the present invention, the second counting section 1305 may be configured to include down counters. In this case, the second counting section 1305 operates while a final output is changed from 0x1111b to 0x0000b. If the final output becomes 0x0000b, the output signal of the second write control signal SETP<3> drives the reset controlling section 1307.

The reset controlling section 1307 is configured to enable the reset signal QSRSTP when the code value of the second write control signals SETP<0:3> outputted from the second counting section 1305 reaches a predetermined value, that is, when the output signal of the second write control signal SETP<3> transitions from a high level to a low level.

To this end, the reset controlling section 1307 may include a count end control part and a pulse generation part. The count end control part generates a quenching pulse completion signal QSND as counting of the second counting section 1305 is completed, and the pulse generation part generates the reset signal QSRSTP in response to the quenching pulse completion signal QSND. For example, the quenching pulse completion signal QSND outputted from the count end control part maintains a high level by the programming enable signal PGMP, and transitions to a low level when the second write control signals SETP<3> becomes the low level. The pulse generation part enables the reset signal QSRSTP by the quenching pulse completion signal QSND transitioned to the low level.

The delaying section 1309 is configured to delay the reset signal QSRSTP by a preselected time and generates the program completion signal PGMNDP. The program completion signal PGMNDP is transmitted to the controller 300 and notifies that the program is completed.

Figure 14:
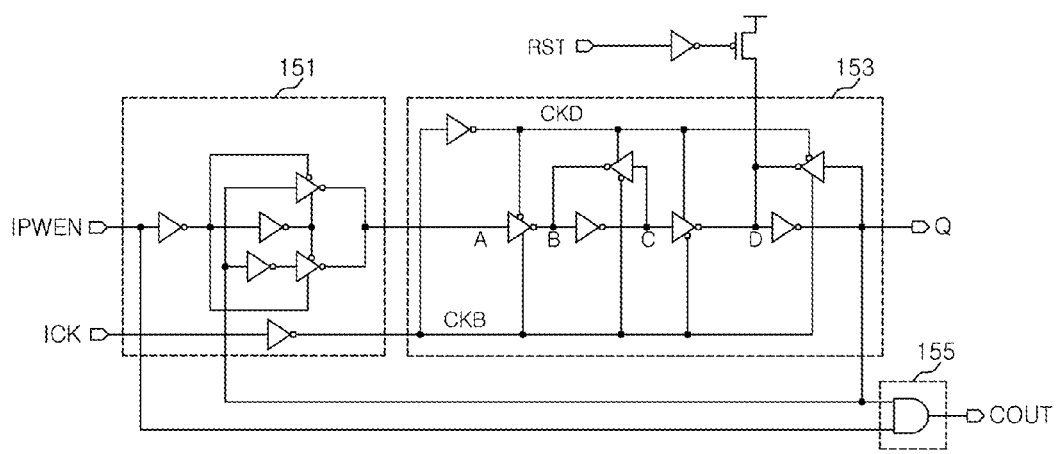
FIG. 14 is an exemplary view illustrating a configuration of the first counting section shown in FIG. 13.

FIG. 14 is an exemplary view illustrating a configuration of the first counting section shown in FIG. 13.

In an embodiment of the present invention, the first counting section 1105 may be configured using a plurality of 1-bit up counters, and FIG. 14 shows an example of an up counter.

Referring to FIG. 14, a 1-bit up counter 150 may include a signal input part 151, a latch part 153, and a carry generation part 155.

The signal input part 151 is configured to determine the level of the signal of an input node A of the latch part 153 in response to a count enable signal, that is, the internal clock enable signal IPWEN and the first counting code Q<0> in an embodiment of the present invention.

The latch part 153 is configured to latch the signal outputted from the signal input part 151 according to the control of the internal clock ICK and output the first counting code Q<0>. The carry generation part 155 is configured to output a carry signal COUT according to the internal clock enable signal IPWEN and the first counting code Q<0>. The carry signal COUT is used as a count enable signal of a next stage 1-bit up counter. The internal node of the latch part 153 is initialized or is changed to a specified level in response to the count reset signal IPWRST.

In detail, the signal input part 151 selects the resultant value of an output node Q when the internal clock enable signal IPWEN is disabled to a low level, and oppositely selects the resultant value of the output node Q and transfers the oppositely selected resultant value to the next stage 1-bit up counter when the internal clock enable signal IPWEN is enabled to the high level.

The latch part 153 transfers the signal of the node A to a node C when the signal of the node A is a low level, and transfers the signal of the node A to the output node Q when the signal of the node A is a high level.

If the count reset signal IPWRST becomes the high level, the output node Q is reset to a low level, and the carry generation part 155 operates according to the signal applied to the output node Q of a previous stage 1-bit up counter, which serves as a count enable signal. That is to say, according to the signal level of the signal applied to the output node Q of a previous stage 1-bit up counter, a next stage 1-bit up counter toggles.

Figure 15:
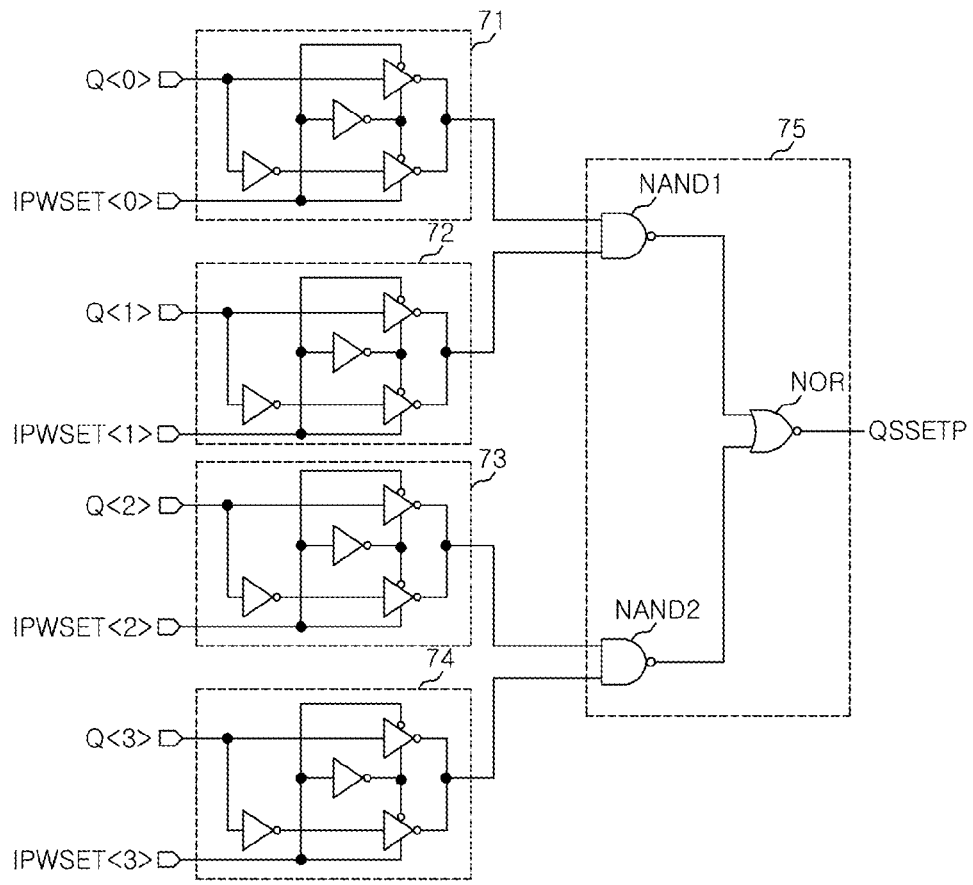
FIG. 15 is a view exemplifying a comparing section shown in FIG. 13.

FIG. 15 is a view exemplifying the comparing section shown in FIG. 13.

Referring to FIG. 15, the comparing section 1107 may include a plurality of comparison parts 71, 72, 73 and 74 and a signal combination part 75. The plurality of comparison parts 71, 72, 73 and 74 are configured to compare respective bit values of the counting codes Q<0:3> and the time control codes IPWSET<0:3> and output a plurality of comparison result signals. The signal combination part 75 is configured to combine the plurality of comparison result signals outputted from the plurality of comparison parts 71, 72, 73 and 74, and output the period setting signal QSSETP. In other words, in an embodiment, the comparing section 1107 activates and outputs the period setting signal QSSETP when the counting codes Q<0:3> and the time control codes IPWSET<0:3> are the same with each other.

Figure 16:
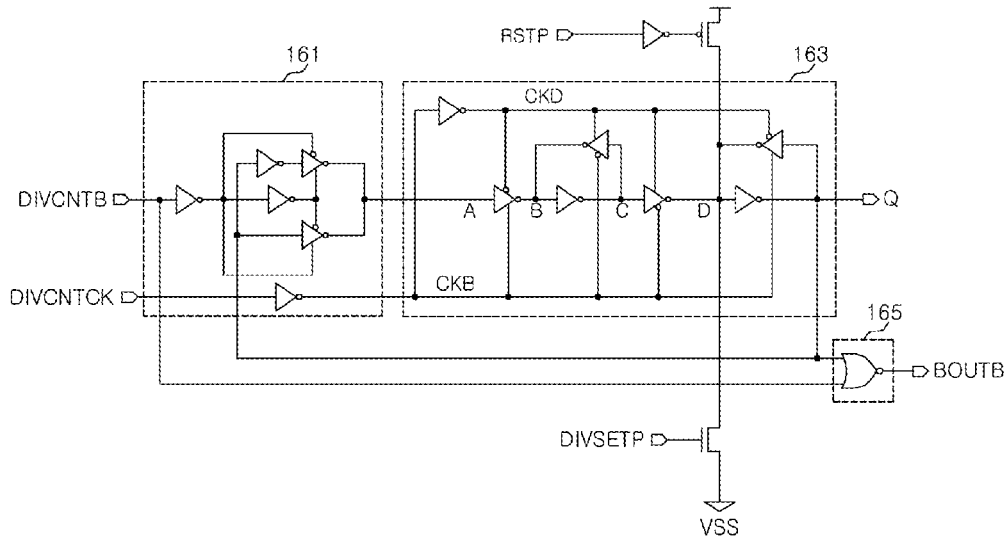
FIG. 16 is a view illustrating configurations of a count unit shown in FIG. 9 and a second counting section shown in FIG. 13.

FIG. 16 is a view illustrating configurations of the count unit shown in FIG. 9 and the second counting section shown in FIG. 13. Further, the counter shown in FIG. 16 may be applied to the count end control part shown in FIG. 13, and may be configured using a 1-bit down counter. Hereinbelow, it will be exemplified that the counter shown in FIG. 16 is applied to FIG. 9.

Referring to FIG. 16, the 1-bit down counter 160 may include a signal input part 161, a latch part 163, and a borrow generation part 165.

The signal input part 161 is configured to determine the level of the signal of an input node A of the latch part 163 according to the count enable signal DIVCNTB and the count signal DIVCNT applied to an output node Q.

The latch part 163 is configured to latch the signal outputted from the signal input part 161 according to the control of the clock signal DIVCNTCK, and output the count signal DIVCNT to the output node Q.

The borrow generation part 165 is configured to output a borrow signal BOUTB, that is, the count completion signal BCNTB, according to the count enable signal DIVCNTB and the level of the signal applied to the output node of the latch part 163. The borrow signal BOUTB is used as a count enable signal of a next stage 1-bit down counter. The internal node of the latch part 163 is initialized or is changed to a specified level in response to the reset signal RSTP and the set signal DIVSETP.

In detail, the signal input part 161 selects the resultant value of the output node Q when the count enable signal DIVCNTB is disabled to a high level, and oppositely selects the resultant value of the output node Q and transfers the oppositely selected resultant value to a next stage when the count enable signal DIVCNTB is enabled to a low level.

The signal selected by the signal input part 161 is applied to the node A. Accordingly, the latch part 163 transfers the signal of the node A to a node C when the signal of the node A is a low level, and transfers the signal of the node A to the output node Q when the signal of the node A is a high level.

If the set signal DIVSETP becomes a high level, the output node Q is set to a high level. If the reset signal RSTP becomes a high level, the output node Q is reset to a low level.

The borrow generation part 165 outputs the borrow signal BOUTB of a low level when the output node Q of a previous stage 1-bit down counter becomes a low level, and transfers the borrow signal BOUTB to a next stage 1-bit down counter. Accordingly, only when the level of the borrow signal BOUTB by the previous stage 1-bit down counter is low, the next-stage 1-bit down counter may toggle.

Figure 17:
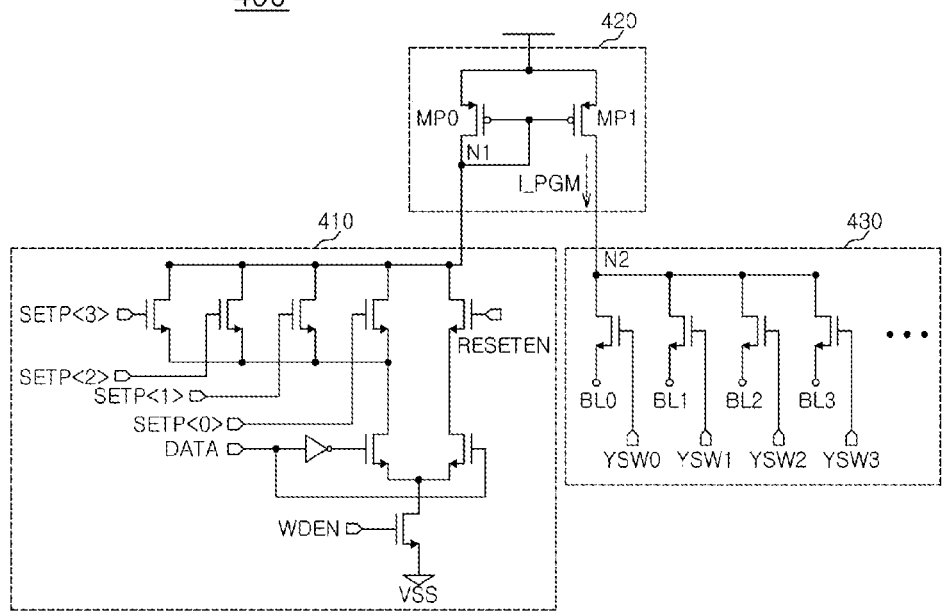
FIG. 17 is a view exemplifying a write driver which may be applied to an embodiment of the present invention.

FIG. 17 is a view exemplifying a write driver which may included in the present invention.

Referring to FIG. 17, the write driver 400 may include a current controlling section 410, a current driving section 420, and a selecting section 430.

The current controlling section 410 is configured to receive the data DATA to be programmed, and control the voltage level of a control node N1 according to a code combination of the first write control signal RESETEN and the second write control signals SETP<0:3> when the write enable signal WDEN is activated. A plurality of NMOS transistors, which are controlled by the second write control signals SETP<0:3>, are selectively turned on and control the voltage level of the control node N1. An NMOS transistor, which is controlled by the first write control signal RESETEN, is turned on when the first write control signal RESETEN is activated and controls the voltage level of the control node N1.

The second write control signals SETP<0:3> are signals which are cyclically updated, and the first write control signal RESETEN is a signal which is inputted in the form of a pulse.

The current driving section 420 is configured to drive the programming current pulse I_PGM which has a magnitude corresponding to the voltage level of the control node N1. The current driving section 420 may drive the current pulse I_PGM to an output node N2. The programming current pulse I_PGM may be divided into a first programming current pulse which corresponds to the first write control signal RESETEN and a second programming current pulse which corresponds to the second write control signals SETP<0:3>.

The selecting section 430 is configured to output the programming current pulse I_PGM driven by the current driving section 420 to bit lines BL0 to BLm corresponding to the plurality of bit line select switch control signals YSW<0:m>.

Figure 18:
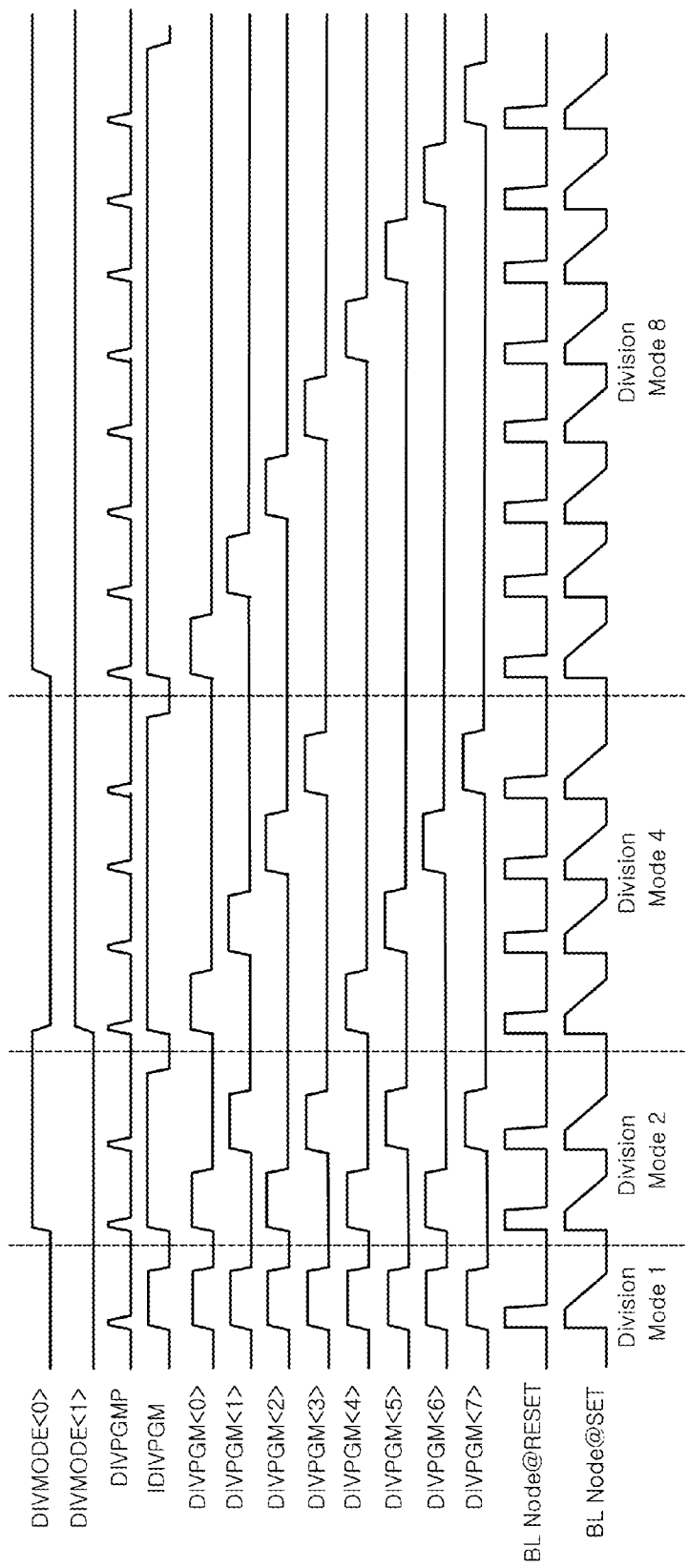
FIG. 18 is a timing diagram illustrating operations of a semiconductor memory apparatus according to a divisional program mode.

FIG. 18 is a timing diagram illustrating operations of a semiconductor memory apparatus according to a divisional program mode. Descriptions will be made with additional reference back to FIG. 9.

When the number of division times is 1 (division mode 1), both the division option codes DIVMODE<0:1> may be low levels, and in this case, the count unit 210 does not operate and the pulse outputting section 233 of the divisional program pulse generation unit 230 transfers the programming enable signal PGMP as the divisional programming enable signal DIVPGMP as it is. The divisional period enable signal IDIVPGM is outputted at a high level.

Accordingly, all the division codes DIVPGM<0:x> outputted from the divisional code generating section 241 of the region select control unit 240 become high levels. That is to say, write drivers for controlling a memory region selected without dividing the memory region are all driven and a program operation is performed.

A reset pulse is supplied to a cell where reset data is to be programmed, by the first write control signal RESETEN, and a set pulse is supplied to a cell where set data is to be programmed, by the second write control signals SETP<0:n>.

When the number of division times is 2 (division mode 2), the division option codes DIVMODE<0:1> may respectively be a high level and a low level, and the divisional programming enable signal DIVPGMP is generated from the program completion signal PGMNDP which is generated after a first program operation is completed. Moreover, the divisional code generating section 241 of the region select control unit 240 enables the even-numbered division codes DIVPGM<0, 2, 4, 6> in a first divisional program mode, and enables the odd-numbered division codes DIVPGM<1, 3, 5, 7> in a second divisional program mode.

Similarly, when the number of division times is 4 (division mode 4), the divisional code generating section 241 of the region select control unit 240 enables the division codes DIVPGM<0, 4> in a first divisional program mode, enables the division codes DIVPGM<1, 5> in a second divisional program mode, enables the division codes DIVPGM<2, 6> in a third divisional program mode, and enables the division codes DIVPGM<3, 7> in a fourth divisional program mode.

Furthermore, when the number of division times is 8 (division mode 8), the divisional code generating section 241 of the region select control unit 240 sequentially enables the division codes DIVPGM<0:7> and transfers the sequentially enabled division codes DIVPGM<0:7> to the write driver and the controller.

Each divisional program operation is started by the divisional programming enable signal DIVPGMP, the divisional programming enable signal DIVPGMP is generated from the program completion signal PGMNDP as described above.

Figure 19:
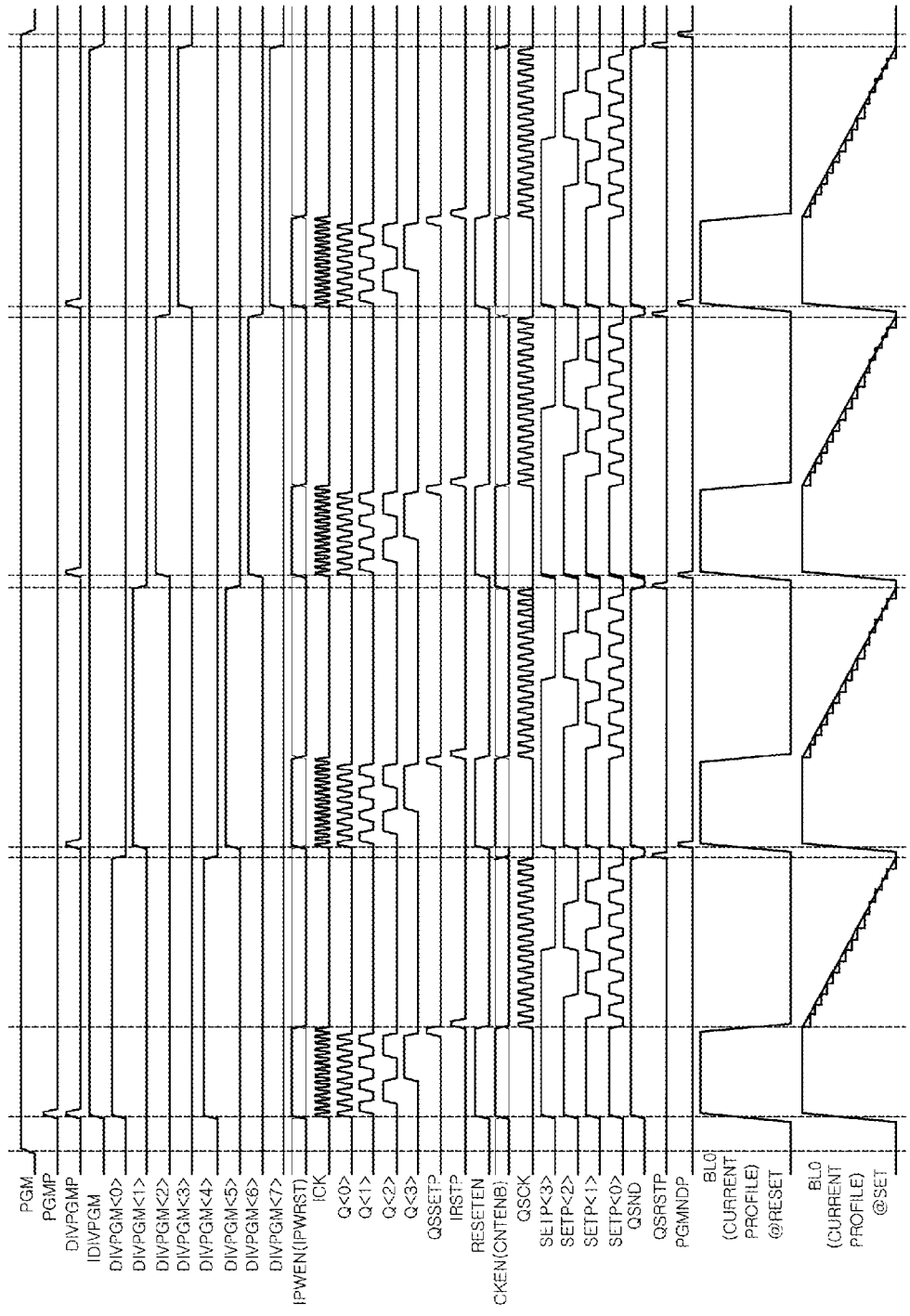
FIG. 19 is a timing diagram illustrating program operations when the number of division times is 4.

FIG. 19 is a timing diagram illustrating program operations in the case where the number of division times is 4.

As the program command PGM is applied, the programming enable signal PGMP is generated from the controller 300, and the divisional program pulse generation unit 230 transfers the programming enable signal PGMP without modification as the divisional programming enable signal DIVPGMP.

Among the division codes outputted from the region select control unit 240, the division codes DIVPGM<0, 4> are enabled in a first divisional program mode as described above with reference to FIG. 18.

Meanwhile, the initial pulse generation unit 110 generates the internal clock enable signal IPWEN. After the internal clock ICK is generated from the internal clock enable signal IPWEN, the counting codes Q<0:3> are generated by counting the predetermined time, and the period setting signal QSSETP is generated when the counting is completed.

The reset pulse generation unit 120 enables the first write control signal RESETEN in response to the programming enable signal PGMP, and, as the reset signal IRSTP generated by delaying the period setting signal QSSETP by the predefined time is enabled, the reset pulse generation unit 120 disables the first write control signal RESETEN. During the period in which the first write control signal RESETEN is enabled, the programming current is generated from the write driver 400 and is provided to the bit line BL0.

The quenching pulse generation unit 130 generates the count enable signal CKEN (CNTENB) and the internal clock QSCK in response to the period setting signal QSSETP. Further, according to this fact, the quenching pulse generation unit 130 generates the second write control signals SETP<0:3> which have different enable periods. When generation of the second write control signals SETP<0:3> is completed, the quenching pulse completion signal QSND is disabled, and, as the reset signal QSRSTP is enabled accordingly, the program completion signal PGMNDP is outputted. In this case, as the current driving force of the write driver 400 is sequentially damped according to the enable periods of the second write control signals SETP<0:3>, a quenching pulse is provided to a memory cell. In an embodiment, the write driver 400 has a corresponding connection with a unit of bit lines where the unit of bit lines is comprised of a predetermined number of bit lines.

Since the number of division times is 4, a second program operation is performed by the program completion signal PGMNDP. At this time, as the division codes DIVPGM<1, 5> are enabled, program is performed through the process as described above.

The division codes DIVPGM<2, 6> are enabled in a third divisional program mode and the division codes DIVPGM<3, 7> are enabled in a fourth divisional program mode, and a reset pulse and a set pulse are supplied according to the first write control signal RESETEN and the second write control signals SETP<0:n>, by which a program operation is implemented.

In this way, in an embodiment of the present invention, when data to be programmed are simultaneously inputted from a host, a region of a memory block to be programmed is internally divided, and the simultaneously inputted data are programmed by being divided.

As a consequence, since it is possible to prevent the influence of noise resulting from peak current generation, program operations can be performed in a stable and precise manner.

While certain embodiments have been described above, it will be understood to those skilled in the art that the embodiments described are by way of example only. Accordingly, the semiconductor memory apparatus, and the divisional program control circuit and the program method therefor described herein should not be limited based on the described embodiments. Rather, the semiconductor memory apparatus, and the divisional program control circuit and the program method therefor described herein should be understood in light of the claims that follow when taken in conjunction with the above description and accompanying drawings.

What is claimed is:

1. A semiconductor memory apparatus comprising:
a program pulse generation block configured to generate write control signals and a program completion signal in response to a programming enable signal;
a divisional program control circuit configured to generate a divisional programming enable signal according to a predetermined number of program division times and a level of a divisional period enable signal which indicates a divisional program mode, in response to the program completion signal and the divisional period enable signal; and
a controller configured to generate the programming enable signal in response to the divisional programming enable signal.

2. The semiconductor memory apparatus according to claim 1, wherein the program pulse generation block generates the write control signals in response to the programming enable signal, and generates the program completion signal when an operation for generating the write control signals is completed.

3. The semiconductor memory apparatus according to claim 1, wherein the divisional program control circuit generates the divisional programming enable signal through a counting operation according to the predetermined number of program division times where the divisional programming enable is generated in response to the program completion signal.

4. The semiconductor memory apparatus according to claim 3, wherein the divisional program control circuit generates division codes in response to division mode signals which designate divisional program regions in correspondence to the predetermined number of program division times.

5. The semiconductor memory apparatus according to claim 4, further comprising:
a write driver configured to be driven according to the division codes and provide program current generated in response to the write control signals to a memory block.

6. The semiconductor memory apparatus according to claim 1, further comprising:
a write driver configured to generate program current corresponding to the write control signals and program data to a memory block.

7. The semiconductor memory apparatus according to claim 6,
wherein the program pulse generation block generates the write control signals a number of times corresponding to the predetermined number of program division times, and the write driver is connected with a unit of bit lines comprising a predetermined number of bit lines, and
wherein the controller drives a corresponding write driver when the write control signals are generated, and programs data to the memory block.

8. The semiconductor memory apparatus according to claim 6, wherein the memory block includes a plurality of memory cells in and from which data are recorded and sensed in a current driving scheme.

9. A semiconductor memory apparatus comprising:
a program pulse generation block configured to output write control signals in response to a programming enable signal which is generated according to a divisional programming enable signal; and
a write driver configured to provide a program pulse generated in response to the write control signals, to a memory block,
wherein the divisional programming enable signal is generated in response to a program completion signal and the divisional period enable signal which indicates a divisional program mode.

10. The semiconductor memory apparatus according to claim 9, wherein the divisional programming enable signal is enabled in correspondence to a predetermined number of program division times.

11. The semiconductor memory apparatus according to claim 10, wherein the program pulse generation block generates the write control signals a number of times corresponding to the predetermined number of program division times.

12. The semiconductor memory apparatus according to claim 9, wherein the program pulse generation block generates a program completion signal after the write control signals are generated, and generates the divisional programming enable signal in response to the program completion signal.

13. The semiconductor memory apparatus according to claim 9, wherein the write control signals include a first write control signal for programming data of a first level and second write control signals for programming data of a second level.

14. A divisional program control circuit,
wherein the divisional program control circuit is connected with a program pulse generation block which generates a program completion signal, in response to a programming enable signal which is generated according to a divisional programming enable signal, and
wherein the divisional program control circuit generates the divisional programming enable signal according to a predetermined number of program division times, in response to the program completion signal,
wherein the divisional programming enable signal is generated in response to a program completion signal and the divisional period enable signal which indicates a divisional program mode.

15. The divisional program control circuit according to claim 14, wherein the divisional program control circuit comprises:
- a count unit configured to generate count signals and count completion signals through a counting operation responsive to the program completion signal;
- a mode determination unit configured to generate a mode determination signal in response to the count completion signals and division mode signals which designate divisional program regions;
- a divisional program pulse generation unit configured to be driven according to the mode determination signal and generate the divisional programming enable signal in response to the programming enable signal and the program completion signal; and
- a region select control unit configured to be driven according to the mode determination signal and output division codes in response to the division mode signals and the count signals.

16. The divisional program control circuit according to claim 15, wherein the divisional program pulse generation unit outputs any one of the programming enable signal and the program completion signal as the divisional programming enable signal.

17. The divisional program control circuit according to claim 15, wherein the count unit comprises a plurality of counters which are connected in series to count a number of divisional program times in response to a count enable signal, a clock signal generated from the program completion signal, a set signal and a reset signal.

18. The divisional program control circuit according to claim 17, wherein each counter comprises a down counter.

19. The divisional program control circuit according to claim 15, wherein the divisional program pulse generation unit comprises:
- a period setting section configured to generate divisional period enable signal, where the divisional period enable signal is generated in response to the mode determination signal, the clock signal, the set signal and the reset signal; and
- a pulse outputting section configured to output the divisional programming enable signal in response to the divisional period enable signal, the programming enable signal and the program completion signal.

20. The divisional program control circuit according to claim 19, wherein the period setting section comprises a down counter.

21. The divisional program control circuit according to claim 19, wherein the region select control unit comprises a divisional code generating section configured to be driven according to the mode determination signal and generate the division codes in response to the divisional period enable signal, the division mode signals and the count signals.

22. The divisional program control circuit according to claim 21, wherein the division mode signals are preset to a fuse option, a mode register set or a test mode signal.

23. The divisional program control circuit according to claim 21, wherein the division program control circuit drives a write driver by the division codes.

24. A program method for a semiconductor memory apparatus, comprising:
- inputting program data to the semiconductor memory apparatus comprising a program pulse generation block;
- repeatedly generating a programming enable signal with a preset cycle in correspondence to a predetermined number of program division times by the program pulse generation block, in response to a program completion signal and a divisional period enable signal which indicates a divisional program mode; and
- programming data to a selected region of a memory block by a write driver, in response to the programming enable signal.

25. The method according to claim 24,
wherein the data is programmed to the selected region of the memory block according to write control signals which are generated in response to the programming enable signal, and
wherein the method further comprises:
outputting program completion signal after the write control signals are generated.

26. The method according to claim 25, wherein the programming enable signal is repeatedly generated with a generating cycle of the program completion signal.

27. The method according to claim 25, wherein the programming enable signal is generated according to a divisional programming enable signal which is generated in response to the program completion signal.

28. The method according to claim 24,
wherein the method further comprises:
generating division mode signals which designate divisional program regions, in correspondence to the predetermined number of program division times, and
wherein the programming of data comprises:
programming data to a region selected by the division mode signals.

* * * * *